United States Patent [19]

Miller

[11] Patent Number: 4,700,131
[45] Date of Patent: Oct. 13, 1987

[54] MUTUAL INDUCTOR CURRENT SENSOR

[75] Inventor: Robert C. Miller, Salem Twp., Westmoreland County, Pa.

[73] Assignee: Westinghouse Electric Corp., Pittsburgh, Pa.

[21] Appl. No.: 848,522

[22] Filed: Apr. 7, 1986

[51] Int. Cl.$^4$ ............................................. G01R 22/00
[52] U.S. Cl. .............................. 324/117 H; 310/68 C; 336/118; 336/223
[58] Field of Search ............... 324/117 H, 127, 117 R, 324/158 MG; 361/25, 70, 103, 37; 310/68 C; 336/188, 173, 223; 307/127

[56] References Cited

U.S. PATENT DOCUMENTS

| | | | |
|---|---|---|---|
| 3,504,283 | 3/1970 | Meservey | 324/127 |
| 3,886,449 | 5/1975 | Wolfinger | 324/142 |
| 4,303,881 | 12/1981 | Ezerwien et al. | 324/142 |
| 4,510,548 | 4/1985 | Boothman | 361/76 |
| 4,513,274 | 4/1985 | Holder | 336/173 |
| 4,544,982 | 10/1985 | Boothman et al. | 361/76 |

Primary Examiner—Ernest F. Karlsen
Assistant Examiner—W. Burns
Attorney, Agent, or Firm—M. J. Moran

[57] ABSTRACT

The invention set forth herein is a three phase current sensor for providing a signal indicative to the three phase current and phase imbalance. The sensor comprises an electrically insulated current carrying conductor for each phase with one end of the conductor forming a line side connection and the other end of the conductor forming a load side connection. Each conductor is substantially U-shaped in configuration having leg portions and a bight portion. The conductors are positioned proximate one another and have their bight portions overlapping forming a cylinder-like cup. The cup has a bottom portion and a wall portion, the bottom portion formed by the bight portions of the conductors and the wall portion formed by the leg portions of the conductors. The leg portions of each conductor is substantially parallel to the longitudinal axis of the cup and radially positioned approximately 60 from the leg portions of the other conductors forming the cup. A signal generator is positioned within the interior of the cup and includes a pair of magnetic sensors. These sensors are positioned substantially coaxial to the longitudinal axis of the cup and substantially orthogonal with respect to one another. The sensors are used for sensing the rotating magnetic field produced by the current flow in the conductors of the cup. The output of the sensors of the signal generator when summed and squared have a dc term indicative of the sum of the squares of the current flowing in the conductors and an ac term indicative of the phase imbalance.

11 Claims, 13 Drawing Figures

MUTUAL INDUCTOR CURRENT SENSOR

CROSS-REFFERENCE TO RELATED APPLICATIONS

The material presented herein is related to the material presented in the copending application Ser. No. 848,541, filed Apr. 7, 1986 entitled "Dual Current Transformer Current Sensing Method and Sensor".

FIELD OF THE INVENTION

The invention disclosed herein relates to ac current sensors, and, in particular, to current sensors used in motor protection schemes.

BACKGROUND OF THE INVENTION

Overload protection for motors has been traditionally accomplished with the use of thermo-mechanical assemblies (heaters and bimetallic strips) which give a crude approximation of internal motor heating. The protection system monitors each of the phase currents that drive the motor and will trip or disconnect the motor from the line in a time which is inversely proportional to the square of the largest phase current, normally referred to as an $I^2t$ characteristic. Although low in cost, the thermo-mechanical assembly does have drawbacks. As the ambient temperature varies, the current trip characteristics of the heaters and bimetallic strips also change. The $I^2t$ trip characteristic of the system even at room temperature is only a rough model of motors heating due to an overload. Lastly, the technique does not lend itself very well to detecting motor heating due to phase imbalance or phase loss.

Motor protection designers have been looking for an alternative that is more accurate but competitive in cost with the thermo-mechanical assembly. Solid state electronics is an area of interest for the modular overload relay (MOR) designer because there is an ever-growing trend toward putting more calculative power in a smaller area for an ever-decreasing price. If a solid state MOR is used, then the method of sensing the current fed to the motor should change to take advantage of the "real time" monitoring capability that would be intrinsic in the MOR device. Presently, in three phase, three wire systems, current transformers, which are placed around each phase conductor in the three wire system, are used. This arrangement is immune to ambient temperature effects and phase loss detection is possible. However, the requirement of using three current transformers in additionn to the MOR device results in a more costly system than that of the thermo-mechanical assembly. Accordingly, it would be advantageous if the cost of the solid state protection system could be reduced. One means of accomplishing this would be to reduce the number of current sensors required. It is an object of the present invention to set forth the description of one approach that can be used for providing the phase current information while reducing the number of current sensors required to obtain this information.

SUMMARY OF THE INVENTION

The invention set forth herein is a three phase current sensor for providing a signal indicative of the average value of the three phase current and of the phase imbalance. The sensor comprises an electrically insulated current carrying conductor for each phase with one end of the conductor forming a line side connection and the other end of the conductor forming a load side connection. Each conductor is substantially U-shaped in configuration having leg portions and a bight portion. The conductors are positioned proximate one another and have their bight portions overlapping, forming a cylinder-like cup. The cup has a bottom portion and a wall portion, the bottom portion formed by the bight portions of the conductors and the wall portion formed by the leg portions of the conductors. The leg portions of each conductor are substantially parallel to the longitudinal axis of the cup and radially positioned approximately 60 degrees from the leg portions of the other conductors forming the cup. A signal generator is positioned within the interior of the cup and includes a pair of magnetic sensors. These sensors are positioned substantially parallel to and centered about the longitudinal axis of the cup and substantially orthogonal with respect to one another. The magnetic sensors are used for sensing the magnetic field produced by the current flow in the conductors of the cup. Positioned intermediate the signal generator and the interior of the wall portion of the cup is a Faraday shield substantially enclosing the signal generator and providing electrostatic shielding therefor. The outputs of the sensors in the signal generator when squared and summed have a dc term and an ac term. The dc term represents the average value of the sum of the squares of the currents flowing in the conductors. The ac term is at twice the line frequency of the current and is proportional to the product of the positive and negative sequence currents. This ac term is an indication of the phase imbalance in that the presence of a negative sequence current indicates the existence of a phase imbalance condition.

In alternate embodiments the magnetic sensors can comprise two orthogonally positioned multi-turn coils of electrically insulated wire. Further, a magnetic core for enhancing the sensitivity of the current sensor can be positioned within the coils coaxial with the longitudinal axis of the cup. The magnetic core is comprised of a cylinder of ferrous material which may be formed by a stack of ferrous washers or by a helically wound ferrous wire. An outer cylindrical magnetic shield surrounding the current sensor similar in construction to the magnetic core can also be used to enhance sensor sensitivity. Hall effect devices can be used in place of the multi-turn coils. Two orthogonally positioned Hall effect devices or two orthogonally positioned sets of Hall effect devices, each set consisting of two opposed Hall effect devices, can be used. Where four Hall effect devices are used, a summing amplifier or other means is provided for summing the outputs of the opposed Hall effect devices that comprise each set.

BRIEF DESCRIPTION OF THE DRAWINGS

For a better understanding of the invention, reference may be made to the embodiments exemplary of the invention shown in the accompanying drawings wherein.

DETAILED DESCRIPTION

Figure 1:
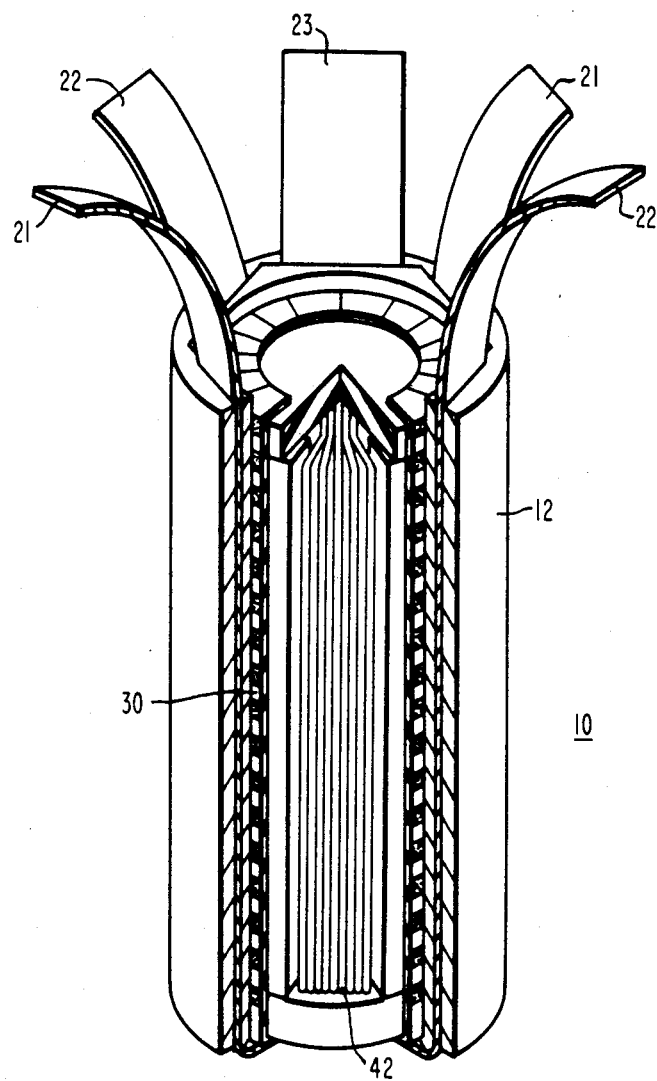
FIG. 1 is an isometric sectional view of the current sensor of the present invention.
Figure 2:
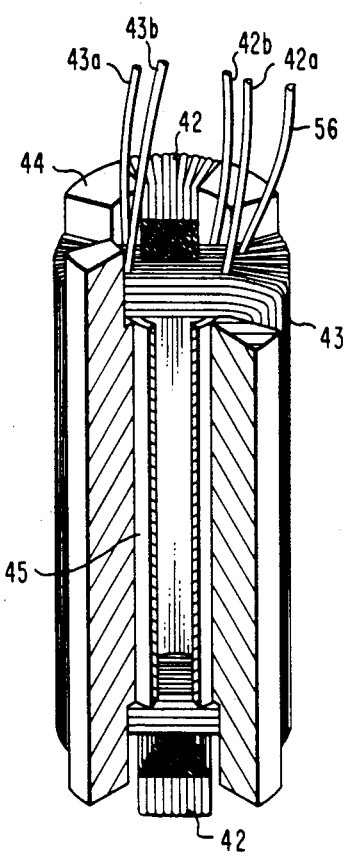
FIG. 2 is an isometric sectional view of the sensing coils of the current sensor.
Figure 3:
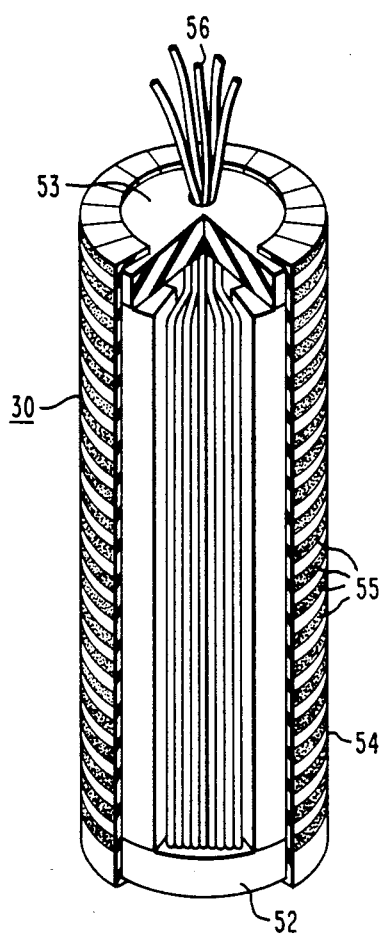
FIGS. 3 and 4 illustrate the construction of the Faraday shield.
Figure 4:
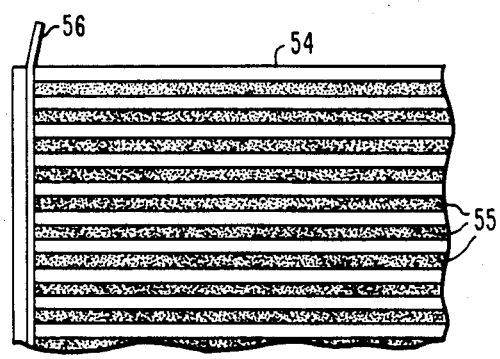

In FIGS. 1 and 2, a three phase current sensor embodying the present invention is shown. The current sensor 10 comprises a tubular outer magnetic shield 12, three current carrying conductors 21, 22 and 23, a Faraday shield 30 and a pair of magnetic sensing coils 42 and 43. These coils are better shown in FIG. 2. The coils 42 and 43 are mounted orthogonally with respect to one another and have a nearly equal number of turns of electrically insulated wire. To facilitate the positioning of the coils 42 and 43, they can be wound on a bobbin 44 having a cruciform cross section. The end leads 42a, 42b of coil 42 and the end leads 43a, 43b, of coil 43 provide the output signals of the current sensor 10. A further increase in the sensitivity of the current sensor 10 can be achieved by winding the coils 42 and 43 around a central magnetic core 45. Positioned about the coils 42 and 43 and core 45 is the Faraday shield 30, the details of which are shown in FIGS. 3 and 4. The Faraday shield 30, which is used to provide electrostatic shielding for the coils 42 and 43, consists of two electrically conducting end plates 52 and 53 and a sheet 54 of insulating material positioned therebetween having a pattern of conductive material 55 printed on it. The arrangement of the conductive material 55 is such that it does not present any large loops of conductive material which would be normal to the magnetic field produced by the currents flowing in the conductors 21, 22 or 23. Thus, the pattern of conductive material 55 on the sheet 54 is positioned substantially perpendicular with respect to the conductors 21, 22, and 23. The end plates 52 and 53 and conductive material 55 are connected to ground via the ground lead 56. When assembled, the Faraday shield 30 resembles a hollow cylinder having closed ends. The Faraday shield 30 is positioned about the coils 42 and 43, substantially enclosing them. Openings are provided in one of the end plates for the passage of the coil end leads 42a, 42b, 43a, and 43b and the ground lead 56 to the exterior of the sensor 10. Another embodiment in lieu of the sheet 54 and conductive material 55 of the Faraday shield 30 would be a helical winding of insulated copper wire or other suitable insulated, conductive material.

Figure 5A:
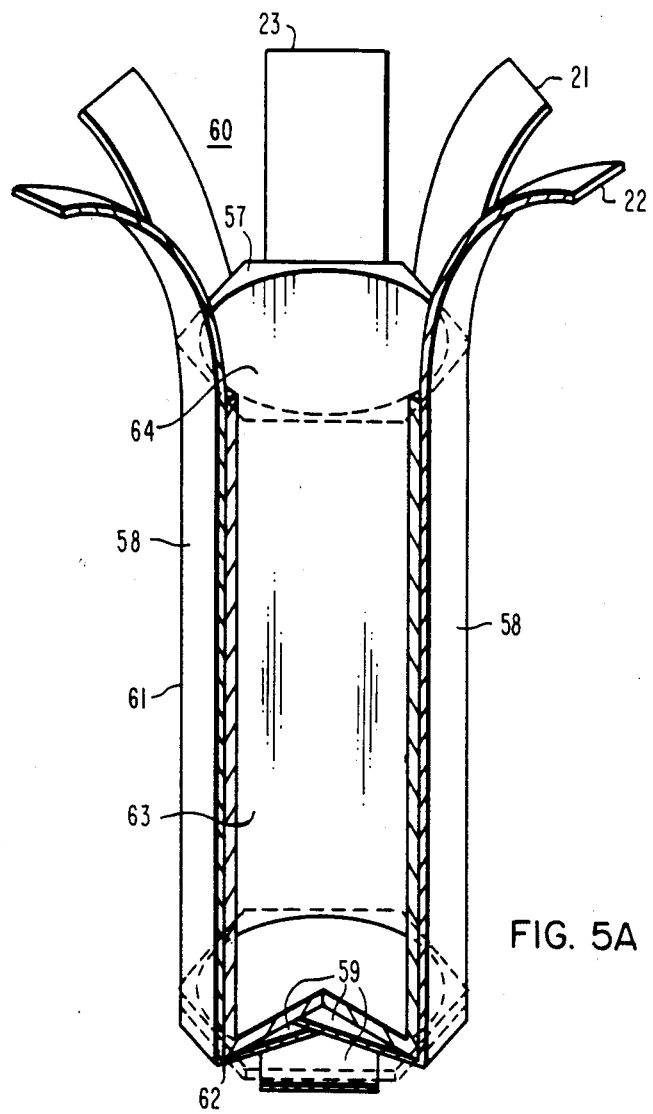
FIGS. 5A and 5B illustrate the arrangement of the current-carrying conductors utilized in the current sensor.
Figure 5B:
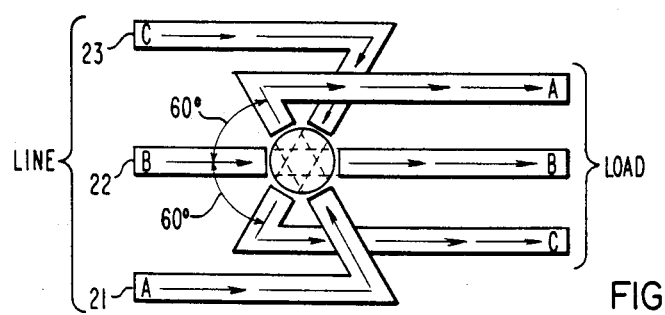

Referring to FIGS. 5A and 5B, the arrangement of the current-carrying conductors 21, 22 and 23 can be seen. The conductors can be fabricated from copper, aluminum or other suitable material of sufficient size to carry the required current. The conductors can be either self-supporting or placed on a bobbin 57 as shown in FIG. 5A. Each of the conductors 21 through 23 has a U-shaped arrangement having leg portions 58 and a bight portion 59. The conductors 21, 22, and 23 are arranged with the bight portions thereof overlapping to form a cylindrical cup 60. The cup 60 has a wall portion 61 comprised of the leg portions 58 of the U-shaped conductors and a bottom portion 62 comprised of the bight portions 59 of the U-shaped conductors. The angular spacing between the conductors should be substantially 60 degrees with respect to one another. The currents in the conductors are spaced apart 120 electrical degrees. The Faraday shield 30 and the coils 41 and 43 are placed within the interior 63 of the cup 60. The Faraday shield 30 is intermediate the coils 42 and 43 and the wall portion 61 and bottom portion 62 of the cup 60. The coils 42 and 43 are substantially parallel to and centered about with the longitudinal axis of the cup 60. Where the bobbin 57 is used, a central opening 64 is provided for receiving the Faraday shield 30 and the coils 42 and 43. The assembly comprised of the conductors 21-23, the Faraday shield 30 and the coils 42 and 43 is then closely received within the outer magnetic shield 12. The free ends of the U-shaped conductors 21-23, the coil leads 42a, 42b, 43a, and 43b from both coils, and the ground lead 56 are appropriately terminated to permit connection of the sensor 10 in an electrical circuit. The output signals of the sensor 10 is provided by the coil leads 42a, 42b, 43a, and 43b that are connected to appropriate signal conditioning circuitry. The connection and angular spacing of the conductors 21-23 of sensor 10 between the line and an electrical load is shown in FIG. 5B.

Figure 7:
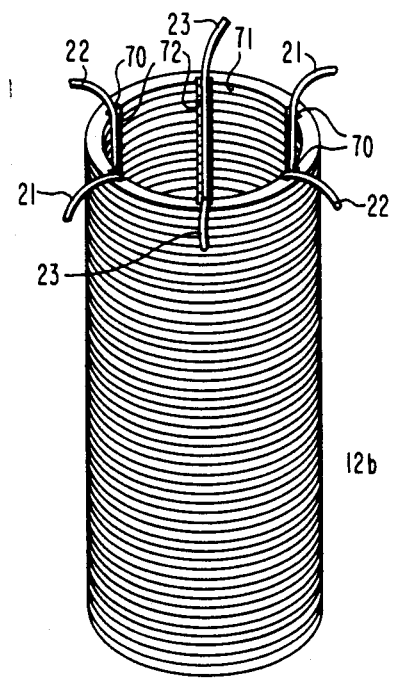
FIG. 7 is an alternate embodiment of the outer magnetic shield using a stack of iron washers.
Figure 6:
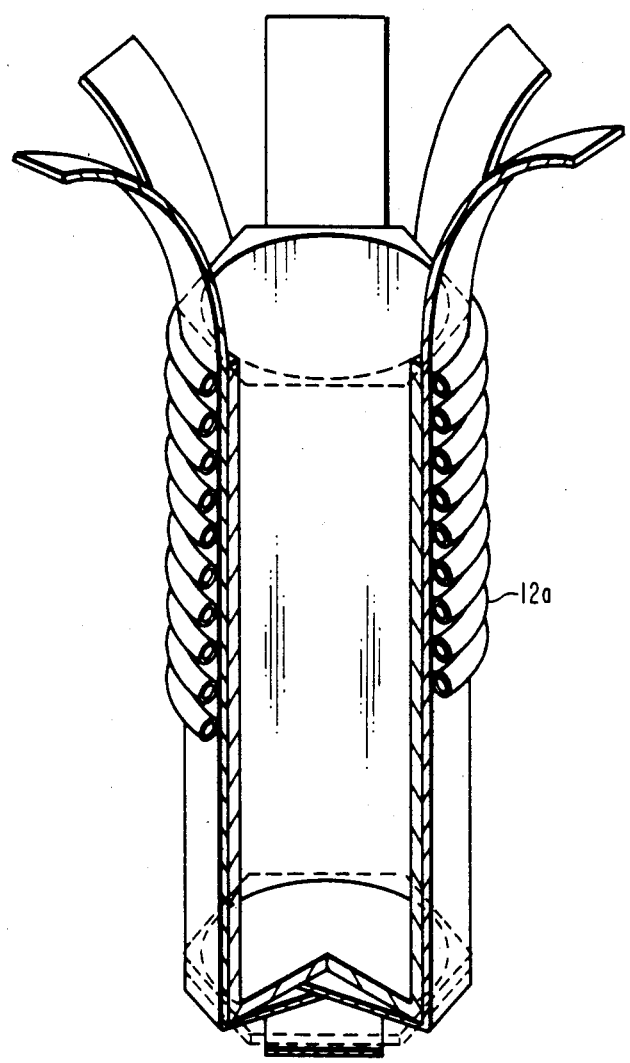
FIG. 6 is an illustration of an alternate embodiment for the outer magnetic shield using a helically wound wire.

The outer magnetic shield 12 is simply a piece of iron tubing of the proper size. If better signal coupling is desired, it can be obtained by replacing the tubular shield 12 with a helical winding 12a of soft iron wire as shown in FIG. 6 or by a stack 12b of iron washers as shown in FIG. 7. Similar structures could be substituted for the inner core 45 of FIG. 2. In FIG. 7 each washer is shown having a number of angularly spaced-apart recesses 70 in their inner rim 71. By aligning the recesses 70 of the washers in the stack a number of channels 72 are formed. These channels can be used to support the conductors 21, 22, 23 shown here as round wire. The spacing of between the recesses 70 is substantially 60 degrees in order to achieve the desired spacing for the conductors 21-23.

The operation of the current sensor is easy to understand if one notes that the ac currents flowing in the conductors 21, 22 and 23 will produce a rotating magnetic field. This field will induce voltages $e_x$ and $e_y$ in the coils 42 and 43, respectively. These voltages are proportional to $d\phi/dt$ where $\phi$ is the magnitude of the rotating field. The integral of either of these voltages with respect to time, i.e., $\int e_x dt = E_x$ or $\int e_y dt = E_y$, is proportional to the linear combination of the line currents, designated $I_A$, $I_B$, and $I_C$, existing in the current-carrying conductors 21, 22 and 23, respectively. Thus, the two output voltage signals $e_x$ and $e_y$ from the coils 42 and 43, respectively, contain sufficient information so that when properly processed they can provide trip signals on the basis of line currents or phase imbalance.

Quantitatively, it can be shown that if the currents through the load are represented by the positive, negative and zero order sequence currents, $I_p$, $I_n$ and $I_o$ respectively, given in equations 1 through 3:

$$I_A = I_p \sin \omega t + I_n (\sin \omega t + \phi) + I_o \sin (\omega t + \theta) \quad (1)$$

$$I_B = I_p \sin (\omega t + 120) + I_n \sin (\omega t + \phi - 120) + I_o \sin (\omega t + \theta) \quad (2)$$

$$I_C = I_p \sin (\omega t + 240) + I_n \sin (\omega t + \phi - 240) + I_o \sin (\omega t + \theta) \quad (3)$$

then $E_x$ and $E_y$ are as given in equations 4 and 5:

$$E_x = \frac{3M_x}{2} \cdot \frac{d}{dt} [(I_p + I_n \cos \phi) \sin \omega t + I_n \sin \phi \cos \omega t] \quad (4)$$

$$E_y = \frac{3M_y}{2} \cdot \frac{d}{dt} [I_n \sin \phi \sin \omega t + (I_p - I_n \cos \phi) \cos \omega t] \quad (5)$$

In equations 4 and 5, $M_x$ is the mutual inductance of the coil 42 to one of the current conductors when the coil 42 is oriented so that it is coplanar with the loop formed by a current conductor, i.e., the U-shaped portion of the current conductor. $M_y$ is defined in the same fashion for the coil 43. Because the two coils are substantially identical, $M_x = M_y = M$. The sum of the squares of the time integrals of $e_x$ and $e_y$ is given in equation 6.

$$[\int e_x dt]^2 + [\int e_y dt]^2 = \frac{9M}{4} \cdot [I_p^2 + I_n^2 - 2I_p I_n \cos (2\omega t + \phi)] \quad (6)$$

This is an equation of an ellipse having semi-major and semi-minor axes of $(3M/2) \cdot (I_p + I_n)$ and $(3M/2) \cdot (I_p - I_n)$, respectively. This can be seen in FIGS. 8 and 9. It can be shown that the average value of the sum of the squared phase currents is proportional to the sum of the squares of the positive, negative and zero order sequence currents as set forth in equation (7).

$$\overline{(I_A)^2} + \overline{(I_B)^2} + \overline{(I_C)^2} = \frac{3}{2}(I_p^2 + I_n^2 + I_o^2) \quad (7)$$

where $\overline{I_A^2}$ is the average value of $I_A^2 \cdot I_B^2$ and $I_C^2$ are defined in the same fashion. Thus, we can write the sum of the squares of the time integrals of $e_x$ and $e_y$ as given in equation (8).

$$[\int e_x dt]^2 + [\int e_y dt]^2 = \quad (8)$$

$$\frac{3M^2}{2}(\overline{I_A^2} + \overline{I_B^2} + \overline{I_C^2}) -$$

$$\frac{9M^2}{2} I_p I_n \cos (2\omega t + \phi) - \frac{9M^2 I_o^2}{4}$$

Equation (8) can be simplified for the three phase, three wire case that applies here in that the zero sequence current $I_o$ is zero, making the third term on the right hand side of Equation (8) zero. This is shown in equation (9).

$$[\int e_x dt]^2 + [\int e_y dt]^2 = \quad (9)$$

$$\frac{3M^2}{2}(\overline{I_A^2} + \overline{I_B^2} + \overline{I_C^2}) - \frac{9M^2}{2} I_p I_n \cos (2\omega t + \phi)$$

The first term on the right-hand side of the equation (9) is a dc term substantially proportional to the average value of the sum of the squares of the three line currents. The second term on the right-hand side of the equation is an ac term of twice the line frequency and proportional to the product of the positive and negative sequence currents $I_p$ and $I_n$, respectively. With a balanced load, the value for the negative sequence current, $I_n$, is zero, thus making the ac term equal to zero. Referring back to equation (6), it would now be realized that where no negative sequence currents occur, the semi-major and semi-minor axes of the ellipse are equal, producing a circle as expected.

Figure 8:
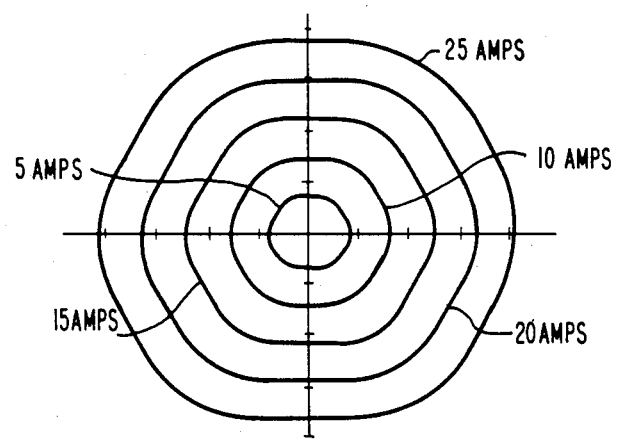
FIG. 8 is a drawing of an oscillograph of the integrated outputs of the current sensor for a balance load connection and various levels of line current.
Figure 9:
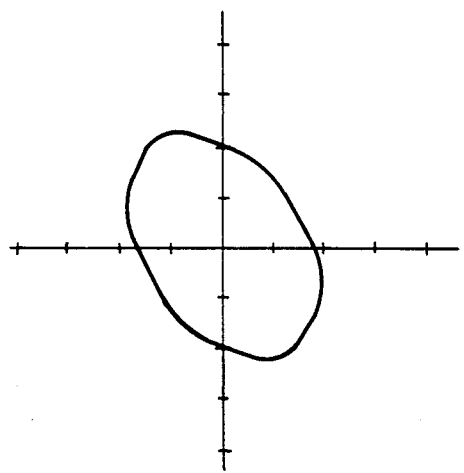
FIG. 9 is a drawing of an oscillograph of the output of the current sensor where there is current imbalance in the load.

If these integrated voltages are connected to the vertical and horizontal inputs of an oscilloscope and a balanced load connected to the current sensor, a circular pattern results whose radius is proportional to the magnitude of the line current. This is shown in FIG. 8. The curves are for line currents of 5, 10, 15, 20 and 25 amps starting from the center. The curves are more nearly hexagons with rounded corners rather than perfect circles because the conductors are localized rather than being uniformly distributed about the center of the device. If an imbalanced load is applied, resulting in the existence of negative sequence currents, the rotating field will not have a constant magnitude and an ellipse will result. This curve is shown in FIG. 9 where the currents in the conductors 21, 22 and 23 were 10, 10 and 20 amps, respectively. The deviations from a perfect circle or ellipse noted in FIGS. 8 and 9 resulting from localized conductors will appear primarily as signals at six times line frequency or higher; and thus cause no significant errors in the operation of the device.

Figure 10:
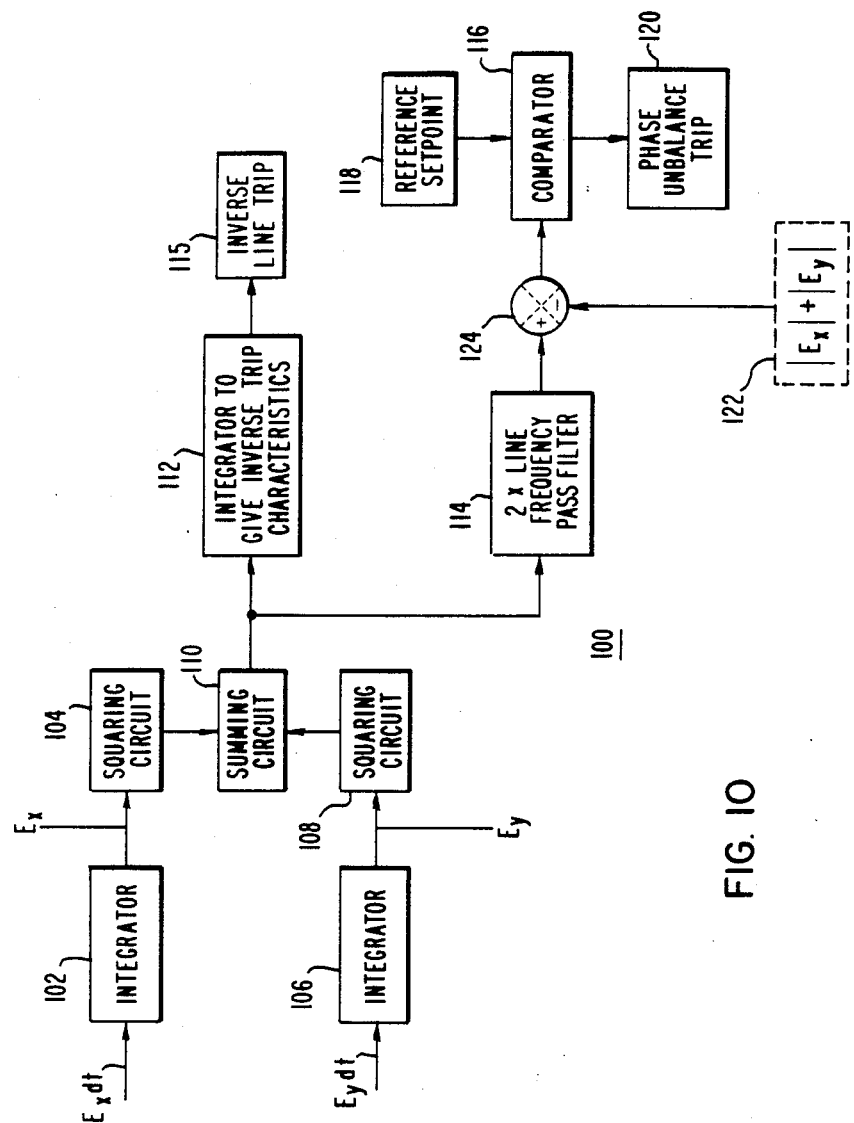
FIG. 10 is a block diagram of a circuit utilizing the outputs of the current sensor to provide an inverse time trip and a phase imbalance trip signals.

In FIG. 10, a block diagram of a circuit 100 using the output of the current sensor 10 is shown. The time varying voltage $e_x$ of coil 42 is supplied as an input to an integrator 102 with the output $E_x$ of the integrator 102 then being squared in the squaring circuit 104. The time varying voltage $e_y$ is similarly treated in integrator 106 and squaring circuit 108. The outputs $E_x^2$ and $E_y^2$ of the two squaring circuits 104 and 108, respectively, are summed together at the summing circuit 110 to produce the signal that is defined as set forth in equation (9). This signal is then sent to an integrator 112 and to a two-times-line-frequency pass filter 114. The output of the integrator 112 provides an inverse time trip indication 115 while the output of the pass filter 114 provides a measure of phase imbalance. A comparator 116, having as inputs the output of the pass filter 114 and a reference setpoint 118, provides an output 120 that is a phase imbalance trip indication. In order to provide a substantially constant sensitivity to the phase imbalance over a range of currents, a signal 122 proportional to the sum of the absolute values for $E_x$ and $E_y$ that appear at the outputs of the integrators 102 and 106, respectively, can be subtracted from the output signal of the pass filter 114. This is shown by the dashed-line summing point 124 connected in the output of the pass filter 114. The circuitry involved with the block diagram is not shown as the various elements contained within the block diagram are well known within the art.

Figure 11:
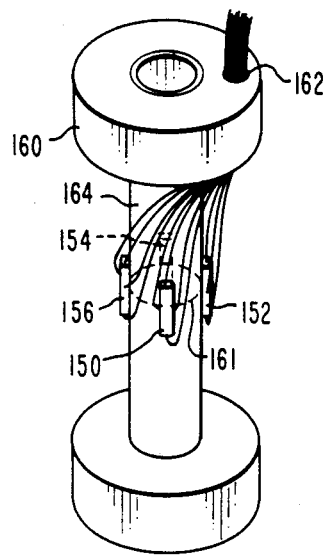
FIG. 11 is an alternate embodiment of the invention utilizing four Hall effect devices.
Figure 12:
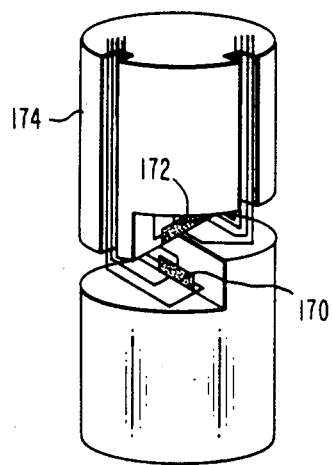
FIG. 12 is an alternate embodiment of the invention utilizing two orthogonally displaced Hall effect devices.

In an alternate arrangement, Hall effect devices or sensors may be used in place of the coils. Preferably, these devices are used where the motor or load is operated at very low frequencies (less than 10 hertz.). In this low frequency application, the Hall effect devices are preferable as they produce a larger output from the rotating magnetic field than that produced by the coils at the low frequencies. FIGS. 11 and 12 illustrate two arrangements of current sensors using the Hall effect devices. In both configurations the arrangement of the conductors and Faraday shield is substantially identical to that previously described and will not be shown in the FIGS. 11 and 12. Because of the small physical size of the Hall effect devices, a carrier or bobbin is used to maintain their placement within the current sensor. In FIG. 11 four Hall effect devices 150, 152, 154, and 156, are mounted in quadrature about the longitudinal axis of a cylindrical bobbin 160 or carrier. The four Hall effect devices are arranged along lines that are radially equidistant from and substantially parallel to the longitudinal axis of the bobbin 160. The devices are also centered about a common plane 161 normal to the longitudinal axis of the bobbin 160. The Hall effect devices are arranged as opposed pairs. Devices 150 and 154 are one set; devices 152 and 156 are the other. A suitable opening 162 is provided in the bobbin 160 to permit connection of the Hall effect devices to a suitable signal conditioning circuit. The bobbin 160 can be dumbbell shaped as shown in with the Hall effect devices positioned on narrow midsection 164 of the dumbbell that lies along the longitudinal axis of the dumbbell. The bobbin 160 and Hall effect devices 150, 152, 154 and 156 are then surrounded by a Faraday shield with this assembly being place within the interior of the cup created by the current carrying conductors. In FIG. 12 two Hall effect devices 170 and 172 are orthogonally positioned on a bobbin 174. Here the devices are axially spaced apart along the longitudinal axis of the bobbin 174 and lie along lines that are perpendicular to the longitudinal axis of the bobbin as well as in planes that are normal to one another. The two Hall effect devices 170 and 172 cross one another at substantially right angles. Preferably, the axial spacing between the devices is minimized. This is done so that both sensors are measuring the essentially same point of the magnetic field. This helps to reduce errors in the output signals due to the sensors having different positions.

In either configuration, a constant dc current source (not shown) is required to power the Hall effect devices. This dc current source can be locally mounted within the sensor or be external to the current sensor. When provided with a constant dc current source, the Hall effect devices will produce a voltage output that is substantially proportional to the linear combination of the line currents $I_A$, $I_B$, and $I_C$ existing in the current carrying conductors. In the four device configuration, a summing amplifier is used to sum the voltage outputs of the devices that comprise each set or pair. For example, the summed output of devices 150 and 154 represents the voltage $E_x$ while that of devices 152 and 156 represents the voltage $E_y$. In the two device configuration this summing amplifier is not required. The output of the Hall effect devices is connected to a signal conditioning circuit substantially the same as that shown in FIG. 10. However, the nature of the Hall effect device output allows the two integrators 102 and 106 to be eliminated. Thus, the current sensor outputs would be provided as inputs to the squaring circuits 104 and 108. The remainder of the circuit would remain essentially the same.

Other embodiments of the invention will be apparent to those skilled in the art from a consideration of the specification or from practice of the invention disclosed herein. It is intended that the specification be considered as exemplary only with the scope and spirit of the present invention being indicated by the following claims.

I claim:

1. In a three phase ac line having a ground and in which positive, negative and zero sequence currents can exist for providing power to an electrical load, a three phase current sensor for providing a signal indicative of the three phase current and phase imbalance of the load, comprising:

an electrically insulated, current carrying conductor for each phase with one end of each conductor forming a line side connection and the other end of each conductor forming a load side connection, each conductor having a substantially U-shaped configuration having leg portions and a bight portion, the conductors positioned proximate one another and having the bight portions thereof overlapping forming a cylindrical cup having a bottom portion and a wall portion, the bottom portion formed by the bight portions of the conductors and the wall portion formed by the leg portions of the conductors, the leg portions of each of the conductors being substantially parallel to a longitudinal axis of the cup and radially positioned approximately 60 degrees from the leg portions of the other conductors in the cup;

signal generator means positioned within the cup and including a pair of magnetic sensors positioned substantially parallel to and centered about the longitudinal axis of the cup and substantially orthogonal with respect to one another for sensing a magnetic field produced by a current flow in the conductors of the cup, the sensors of the signal generator means producing outputs that when squared and summed have a dc term indicative of the sum of the squares of the currents flowing in the conductors of the cup and an ac term indicative of the phase imbalance whereby processing of the dc and ac terms of the output results in the dc term being substantially proportional to the average value of the sum of the squares of the current flowing in the conductors and the ac term being substantially at twice the frequency of the current and substantially proportional to the product of the positive and negative sequence currents; and Faraday shield means substantially enclosing the signal generator means and electrically connected to the ground, the Faraday shield means providing electrostatic shielding of the signal generator means.

2. The current sensor of claim 1 wherein the pair of magnetic sensors comprises two orthogonally positioned, multi-turn coils of electrically insulated wire with each coil having substantially the same number of turns.

3. The current sensor of claim 2 further comprising a magnetic core positioned within the coils and positioned axial with the longitudinal axis of the cup.

4. The current sensor of claim 3 wherein the magnetic core comprises a cylinder of ferrous material.

5. The current sensor of claim 3 wherein the core is a tube formed by ferrous washers.

6. The current sensor of claim 3 wherein the core is a tube formed by helically wound ferrous wire.

7. The current sensor of claim 1 further comprising a tubular ferrous shield closely positioned over and about substantially all of an exterior surface of the wall portion of the cup.

8. The current sensor of claim 1 wherein the signal generator means further comprises:

the pair of magnetic sensors comprising a pair of Hall effect sensors having a dc current input and producing an output; and constant current source means for providing a substantially constant dc current to the dc current input of each of the Hall effect sensors.

9. The current sensor of claim 8 further comprising a tubular ferrous shield closely positioned over and about substantially all of an exterior surface of the wall portion of the cup.

10. The current sensor of claim 1 wherein the signal means further comprises:
 each sensor in the pair of magnetic sensors comprising a set of two opposed Hall effect sensors with each Hall effect sensor having a dc current input and a signal output;
 constant current source means for providing a substantially constant dc current to the dc current input of each of the Hall effect sensors; and
 summing means connected to the signal outputs of each set of opposed Hall effect devices for producing an output for each set of opposed Hall effect sensors that is proportional to the sum of the outputs of the opposed Hall effect sensors in each set.

11. The current sensor of claim 10 further comprising a tubular ferrous shield closely positioned over and about substantially all of an exterior surface of the wall portion of the cup.

* * * * *